(12) United States Patent
Hatsuda

(10) Patent No.: US 11,030,043 B2
(45) Date of Patent: Jun. 8, 2021

(54) ERROR CORRECTION CIRCUIT AND MEMORY SYSTEM

(71) Applicant: TOSHIBA MEMORY CORPORATION, Minato-ku (JP)

(72) Inventor: Kosuke Hatsuda, Bunkyo (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 34 days.

(21) Appl. No.: 16/569,369

(22) Filed: Sep. 12, 2019

(65) Prior Publication Data

US 2020/0293403 A1 Sep. 17, 2020

(30) Foreign Application Priority Data

Mar. 15, 2019 (JP) .............................. JP2019-048981

(51) Int. Cl.
*G06F 11/10* (2006.01)
*H03M 13/15* (2006.01)

(52) U.S. Cl.
CPC ..... *G06F 11/1076* (2013.01); *H03M 13/1575* (2013.01)

(58) Field of Classification Search
CPC .......................... G06F 11/1076; H03M 13/1575
See application file for complete search history.

(56) References Cited

U.S. PATENT DOCUMENTS

| 8,091,010 | B2 | 1/2012 | Yim | |
|---|---|---|---|---|
| 8,732,564 | B2* | 5/2014 | Chinnici | H03M 13/1111 |
| | | | | 714/785 |
| 8,923,041 | B2 | 12/2014 | Andre et al. | |
| 10,097,207 | B2 | 10/2018 | Hatsuda | |
| 10,164,660 | B1* | 12/2018 | Finn | H03M 13/1575 |
| 2007/0198904 | A1 | 8/2007 | Yoshida | |
| 2012/0216098 | A1* | 8/2012 | Moro | H03M 13/09 |
| | | | | 714/785 |
| 2013/0111304 | A1* | 5/2013 | Lin | H03M 13/152 |
| | | | | 714/785 |
| 2013/0246887 | A1* | 9/2013 | Torii | H03M 13/09 |
| | | | | 714/758 |

(Continued)

FOREIGN PATENT DOCUMENTS

| JP | 2007-207325 A | 8/2007 |
|---|---|---|
| JP | 2016-143085 A | 8/2016 |

*Primary Examiner* — Kyle Vallecillo
(74) *Attorney, Agent, or Firm* — Oblon, McClelland, Maier & Neustadt, L.L.P.

(57) ABSTRACT

An error correction circuit includes a syndrome calculator to calculate syndrome information of input data, an error position calculator to calculate error position information of the input data, a holder to hold the syndrome information or the error position information at a predetermined timing, an input switch to select one of error-corrected data of the input data, and the input data, and to input the selected data to the syndrome calculator, an error detection determiner to determine whether an error of the input data has been correctly detected, and an error corrector to correct the error of the input data based on information held by the holder and to output error-corrected input data when it is determined by the error detection determiner that the error has been correctly detected whereas to output the input data with no error correction when it is determined by the error detection determiner.

18 Claims, 5 Drawing Sheets

2 : MEMORY SYSTEM

(56) References Cited

U.S. PATENT DOCUMENTS

| | | | |
|---|---|---|---|
| 2014/0331106 A1* | 11/2014 | Baum | G11C 29/028 |
| | | | 714/766 |
| 2016/0224419 A1 | 8/2016 | Takai et al. | |
| 2020/0210292 A1* | 7/2020 | Kim | H03M 13/153 |

* cited by examiner

ERROR CORRECTION CIRCUIT AND MEMORY SYSTEM

CROSS REFERENCE TO RELATED APPLICATIONS

This application is based upon and claims the benefit of priority from the prior Japanese Patent Application No. 2019-48981, filed on Mar. 15, 2019, the entire contents of which are incorporated herein by reference.

FIELD

Embodiments of the present disclosure relate to an error correction circuit and a memory system.

BACKGROUND

Current volatile memories and nonvolatile memories such as DRAMs and flash memories, respectively, have a tendency that the reliability of written data decreases due to the influence of advanced microfabrication and increase in speed. Accordingly, there is a demand for an error correction circuit to correct an error of the written data.

The error correction circuit has a limit on the number of error-correctable bits. When data including the number of bits exceeding error correction capability of the error correction circuit is input to the error correction circuit, incorrect error correction may be performed, so that the number of error bits may increase.

DETAILED DESCRIPTION

According to the present embodiment, there is provided an error correction circuit including:

a syndrome calculator to calculate syndrome information of input data composed of a plurality of bits;

an error position calculator to calculate error position information of the input data based on the syndrome information;

a holder to hold the syndrome information or the error position information at a predetermined timing;

an input switch to select one of error-corrected data of the input data based on the error position information, and the input data, and to input the selected data to the syndrome calculator;

an error detection determiner to determine whether an error of the input data has been correctly detected, based on syndrome information calculated by inputting the error-corrected data to the syndrome calculator; and an error corrector to correct the error of the input data based on information held by the holder and to output error-corrected input data when it is determined by the error detection determiner that the error has been correctly detected whereas to output the input data with no error correction when it is determined by the error detection determiner that the error has not been correctly detected.

Hereinbelow, embodiments will be explained with reference to the accompanying drawings. In the present specification and the accompanying drawings, for easy understanding and simplicity in drawings, the explanation and drawings are made with omitting, modifying or simplifying part of the configuration. However, the technical contents to the extent that a similar function can be expected will be interpreted to be included in the embodiments.

First Embodiment

Figure 1:
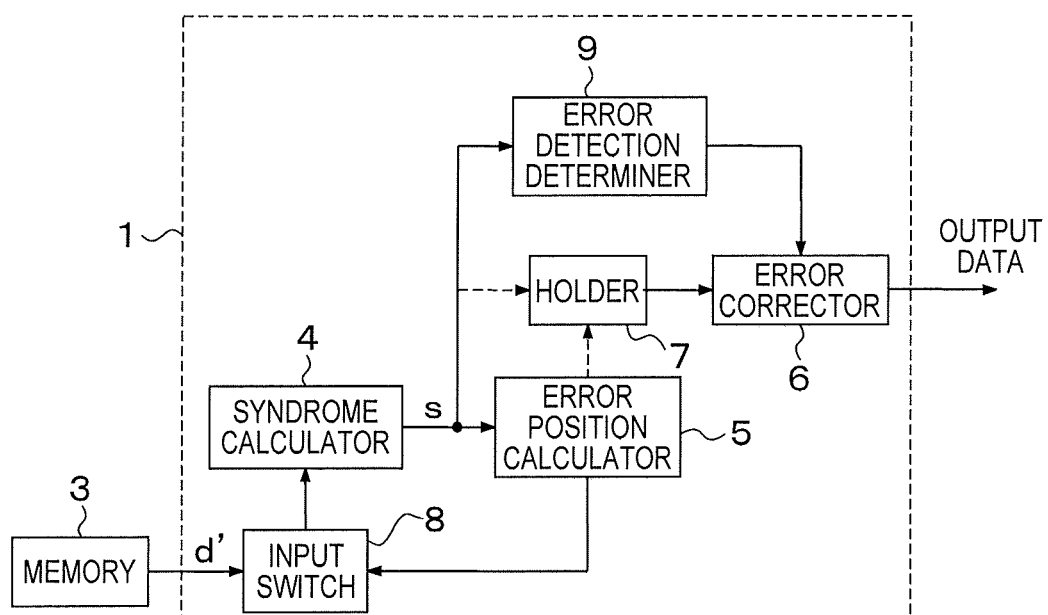
FIG. 1 is a block diagram schematically showing the configuration of a memory system provided with an error correction circuit according to a first embodiment.

FIG. 1 is a block diagram schematically showing the configuration of a memory system 2 having an error correction circuit 1 according to a first embodiment. The memory system 2 of FIG. 1 is provided with a memory 3 and the error correction circuit 1. The memory system 2 according to the present embodiment is also provided with a memory controller and the like not shown, which are however omitted in FIG. 1.

The memory 3 may be a volatile memory or a nonvolatile memory. The volatile memory may, for example, be a DRAM (Dynamic Random Access Memory) or an SRAM (Static Random Access Memory). The nonvolatile memory may, for example, be an MRAM (Magnetoresistive Random Access Memory), a ReRAM (Resistive Random Access Memory), a FeRAM (Ferroelectric Random Access Memory) or a PRAM (Phase-change Random Access Memory).

The error correction circuit 1 of FIG. 1 is provided with a syndrome calculator 4, an error position calculator 5, an error corrector 6, a holder 7, an input switch 8, and an error detection determiner 9. Among them, the syndrome calculator 4, the error position calculator 5, the error corrector 6, and the error detection determiner 9 are essential components.

The syndrome calculator 4 calculates syndrome information of input data composed of a plurality of bits. In the memory system 2 of FIG. 1, the input data is read input data composed of a plurality of bits read from the memory 3. Hereinbelow, read data from the memory 3 is referred to as input data d'.

For example, from the input data d' of n bits, the syndrome calculator 4 generates syndrome information s of nn bits (for example, m<n). When all bits that compose the syndrome information s are 0s, it indicates that the input data d' has no errors. When at least one bit in an nn-bit bit stream that forms the syndrome information s is 1, it indicates that the input data d' has an error. The syndrome information s includes, not only information on whether the input data d' has an error, but information that indicates an error position in the input data d'.

Based on the syndrome information s, the error position calculator 5 calculates error position information of the input data d'. The error position information has the same number of bits as the syndrome information s (for example, m bits).

Based on the error position information, the error corrector 6 performs error correction of the input data d' to generate output data. Due to the difference, in general, in the number of bits between the error position information and the input data d', although omitted in FIG. 1, after a decoding process of matching the number of bits of the error position information with the number of bits of the input data d', the error corrector 6 performs error correction of the input data d' based on the error position information obtained after the decoding process. In more specifically, the error corrector 6 performs a process of inverting an error bit in the input data d'.

Up to how many bits in the input data d' the error corrector 6 can correct errors depends on the configuration of the syndrome calculator 4. When the input data d' includes the number of error bits exceeding error detection capability of the syndrome calculator 4, the syndrome information s output from the syndrome calculator 4 is unreliable information, and hence error correction by the error corrector 6 also becomes unreliable.

The holder 7 holds the syndrome information s or the error position information at a predetermined timing. In the present embodiment, error-corrected data, which is obtained by correcting an error of the input data d' based on the error position information output from the error position calculator 5, is input to the syndrome calculator 4 to calculate the syndrome information s again. The syndrome information s changes due to the re-calculation, and hence in the present embodiment, the original syndrome information s or the error position information calculated based on the original syndrome information s is held by the holder 7.

The holder 7 holds the syndrome information s or the error position information, at a predetermined timing after the error position calculator 5 outputs the error position information. After the holder 7 holds the syndrome information s or the error position information, the syndrome calculator 4 calculates syndrome information s of the error-corrected data of the input data d' based on the error position information.

The input switch 8 selects one of the error-corrected data of the input data d' based on the error position information, and the input data d', and inputs the selected data to the syndrome calculator 4. Before the predetermined timing, the input switch 8 inputs the input data d' to the syndrome calculator 4 whereas, after the predetermined timing, the input switch 8 inputs the error-corrected data to the syndrome calculator 4.

The holder 7 holds the syndrome information s or the error position information, in synchronism with a switching signal whose logic changes at the predetermined timing. The input switch 8 switches between the input data d' and the error-corrected data, and inputs the switched data to the syndrome calculator 4, in synchronism with the switching signal.

The error detection determiner 9 determines whether the error of the input data d' has been correctly detected, based on the syndrome information s calculated by inputting the error-corrected data to the syndrome calculator 4. In more specifically, the error detection determiner 9 determines whether the error of the input data d' has been correctly detected, according to whether all bits that compose the syndrome information s are the same in logic.

When it is determined by the error detection determiner 9 that the error has been correctly detected, the error corrector 6 corrects the error of the input data based on the information held by the holder 7 and outputs error-corrected input data. On the other hand, when it is determined by the error detection determiner 9 that the error has not been correctly detected, the error corrector 6 outputs the input data with no error correction.

Subsequently, the operation of the error correction circuit 1 of FIG. 1 will be explained. In the error correction circuit 1 of FIG. 1, data read from the memory 3 is input as the input data d' to the syndrome calculator 4. The syndrome calculator 4 detects whether there is an error in the input data d' and calculates the syndrome information s that includes information on whether there is an error and also includes information on an error position, if there is an error. The syndrome calculator 4 generates reliable syndrome information s when there are errors in the input data d' within a range of number of bits that does not exceed the error correction capability. If there are errors in the input data d' out of the range of number of bits exceeding the error correction capability, the syndrome information s calculated by the syndrome calculator 4 is unreliable information.

The error position calculator 5 calculates error position information based on the syndrome information s. When the syndrome information s is reliable information, the error position information also becomes reliable information. On the other hand, when the syndrome information s is unreliable information, the error position information also becomes unreliable information. The holder 7 holds the syndrome information s or the error position information.

Since the error position calculator 5 cannot determine whether the syndrome information s is reliable information, in the present embodiment, the syndrome calculator 4 performs re-calculation to determine whether the original syndrome information s is reliable information.

In more specifically, the input switch 8 inputs error-corrected data of the input data d' based on the error position information to the syndrome calculator 4. The error-corrected data of the input data d' based on the error position information is the data obtained after correcting the error of the input data d' using the error position information. If the error position information is reliable information, the error-corrected data of the input data d' based on the error position information must be data with no errors. Therefore, when the error-corrected data is input to the syndrome calculator 4 to perform re-calculation, the re-calculated syndrome information s must be composed of 0s only.

The error detection determiner 9 determines whether the original syndrome information s calculated by inputting the input data d' to the syndrome calculator 4 has been reliable information or not, according to whether the re-calculated syndrome information s is composed of 0s only.

When it is determined by the error detection determiner 9 that the syndrome information s has been reliable information, the error corrector 6 performs error correction of the input data d' based on the syndrome information s or the error position information held by the holder 7. In this case, the data output from the error corrector 6 becomes data for which errors have been exactly corrected. On the other hand, when it is determined by the error detection determiner 9 that the syndrome information s has been unreliable information, the error corrector 6 outputs the input data d' as it is with no error correction. In this case, the input data d' includes the number of error bits exceeding the error detection capability of the syndrome calculator 4, however, by passing the input data d' through the error correction circuit 1, there is no possibility of further increase in the errors of the input data d'.

As described above, in the first embodiment, the error-corrected data, which is obtained by error correction of the input data d' using the error position information calculated based on the syndrome information s, is input to the syndrome calculator 4 to calculate the syndrome information s again. Therefore, whether the original syndrome information s has been reliable information can be known easily and quickly. When it is determined that the original syndrome information s has been unreliable information, the input data d' is output as it is with no error correction, and hence there is no problem of further increase in the number of error bits due to error correction of the input data d' based on the unreliable syndrome information s.

Second Embodiment

An error correction circuit 1 according to a second embodiment is a more specific version of the error correction circuit 1 according to the first embodiment.

Figure 2:
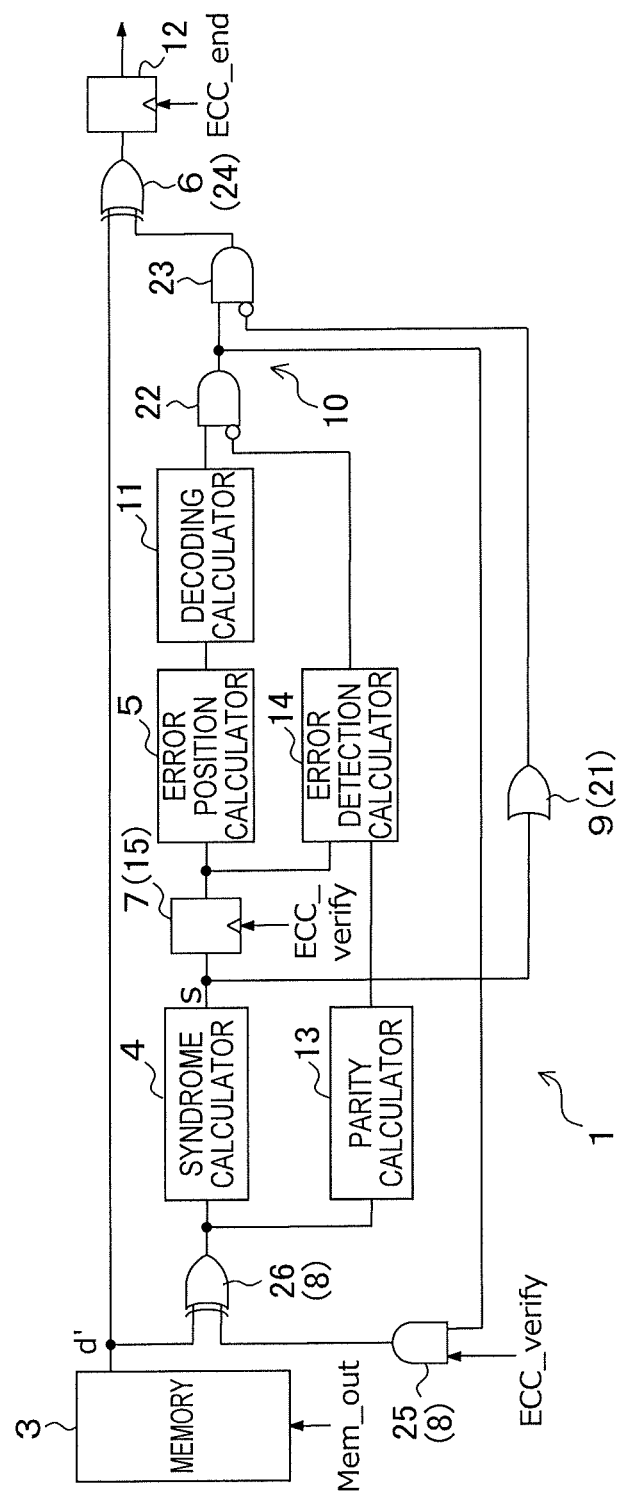
FIG. 2 is a block diagram schematically showing the configuration of a memory system provided with an error correction circuit according to a second embodiment.

FIG. 2 is a block diagram schematically showing the configuration of a memory system 2 having an error correction circuit 1 according to the second embodiment. In FIG. 2, the components common with those in FIG. 1 are given the same signs. Hereinbelow, different points from FIG. 1 will mainly be explained.

The error correction circuit 1 of FIG. 2 is provided, added to the configuration of the error correction circuit 1 of FIG. 1, with an error correction controller 10, a decoding calculator 11, an error correction outputter 12, a parity calculator 13, and an error detection calculator 14.

When it is determined by the error detection determiner 9 that an error has been correctly detected, the error correction controller 10 makes the error corrector 6 perform error correction of the input data d' based on the syndrome information s or the error position information held by the holder 7. On the other hand, when it is determined by the error detection determiner 9 that the error has not been correctly detected, the error correction controller 10 makes the error corrector 6 output the input data d' with no error correction.

The decoding calculator 11 decodes error position information output from the error position calculator 5 to convert the error position information into error position information having the same number of bits as the input data d'. For example, when the number of bits of the error position information is m, the decoding calculator 11 converts the error position information into error position information of n bits (for example, n>m) and outputs the converted error position information. Here, $n=2^{m-1}+a$ where $0<a<2^{m-1}$.

The error correction outputter 12 holds data for which error correction has been performed by the error corrector 6, at a predetermined timing, for example, at a rising edge of an ECC_end signal, and outputs the data. The ECC_end signal is a signal whose logic changes at a slower timing than the timing at which the holder 7 holds the data and is a signal input from the outside of the error correction circuit 1. The error correction outputter 12 has n latches for the same number of bits as the input data d'.

The parity calculator 13 determines that there is no error when the least significant bit of a value is 0, the value being obtained by adding the value of each bit of the input data d' and the value of a 1-bit parity bit, whereas determines that there are an odd number of bit errors when the least significant bit of the above value is 1. As described, the parity calculator 13 can quickly detect errors for an odd number of bits, included in the input data d'.

Based on the output value of the parity calculator 13 and the syndrome information s, the error detection calculator 14 detects errors of bits up to the number of bits that exceeds the detection capability of the syndrome calculator 4 by a predetermined number of bits. In more specifically, the error detection calculator 14 detects errors of bits up to the number of bits that exceeds the detection capability of the syndrome calculator 4 by one bit. Error detection information that is the output of the error detection calculator 14 is 1-bit data which indicates that an error has been detected when the 1-bit data is 0 whereas indicates that no error has been detected when the 1-bit data is 1.

The holder 7 holds the syndrome information s output from the syndrome calculator 4. The holder 7 is a latch 15 for the same number of bits (for example, m bits) as the syndrome information s.

Figure 3:
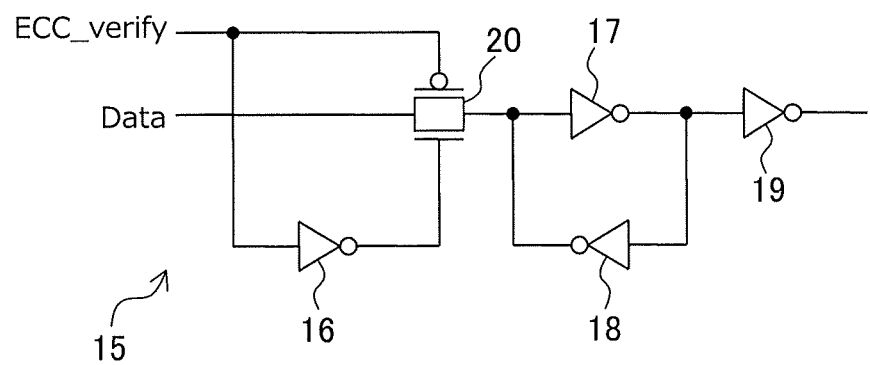
FIG. 3 is a circuit diagram showing an example of the internal configuration of a latch for one bit.

FIG. 3 is a circuit diagram showing an example of the internal configuration of a latch 15 for one bit. The latch 15 of FIG. 3 has a plurality of inverters 16 to 19 and a transfer gate 20. The transfer gate 20 passes input bit Data when an ECC_verify signal is inactive (for example, logic of low). The two inverters 17 and 18 at the latter stage of the transfer gate 20 perform a holding operation. The ECC_verify signal is a signal whose logic changes from inactive to active (for example, logic of high) after the error position calculator 5 outputs error position information. The timing at which the above-described ECC_end signal changes from inactive (for example, logic of low) to active (for example, logic of high) comes after the timing at which the ECC_verify signal changes from inactive to active.

The latch 15 of FIG. 3 outputs the input bit Data as it is while the ECC_verify signal is inactive. When the ECC_verify signal becomes active, the transfer gate 20 shuts off the input bit Data. The two inverters 17 and 18 at the latter stage side of the transfer gate 20 are connected in a manner that the output terminal of the inverter 17 is connected to the input terminal of the inverter 18 and vice versa, so that the inverters 17 and 18 perform an holding operation to hold logic which is the inverse of the logic of input bit Data input immediately before the transfer gate 20 is closed. Since the inverter 19 is located at the latter stage of the inverters 17 and 18, data having the same logic as the input bit Data input immediately before the transfer gate 20 is closed is output from the inverter 19.

As described above, the latch 15 of FIG. 3 outputs the input bit Data with no change in logic while the ECC_verify signal is inactive whereas holds the logic of the input bit Data input immediately before the ECC_verify signal becomes active, while the ECC_verify signal is active.

Here, the ECC_verify signal is a switching signal whose logic changes after the error position calculator 5 outputs the error position information and is a signal input from the outside of the error correction circuit 1.

The holder 7 has, for example, m latches 15 each shown in FIG. 3. The value of m changes in accordance with the number of bits for which error correction is to be performed. When m latches 15 are required for 1-bit correction, m×t latches 15 are required for t-bit correction. The syndrome information s that has passed through or been held by the holder 7 is input to the error position calculator 5 and the error detection calculator 14. The error position calculator 5 calculates an error position of the syndrome information s that has passed through or been held by the holder 7, to output error position information. The error detection calculator 14 outputs error detection information based on the syndrome information s that has passed through or been held by the holder 7 and parity information.

The error detection determiner 9 has, for example, an OR gate 21 with rn-bit inputs. To the OR gate 21, each bit of the syndrome information s is input. The OR gate 21 outputs 0 only when all bits of the syndrome information s are 0s. The OR gate 21 outputs 1 when at least one bit of the syndrome information s is 1. When the output of the OR gate 21 is 0, the syndrome calculator 4 indicates that the input data d' has no errors.

The error correction controller 10 has, for example, n AND gates 22 for n bits and n AND gates 23 arranged at the latter stage side of the AND gates 22. The n AND gates 22 at the former stage side take the logical AND of the corresponding bits of the error position information decoded by the decoding calculator 11 and inverted data of the output of the error detection calculator 14. In other words, the n AND gates 22 at the former stage side output the logic of the corresponding bits of the error position information as it is when the error detection calculator 14 detects an error whereas output 0s when the error detection calculator 14 detects no errors.

The n AND gates 23 at the latter stage side take the logical AND of respective outputs of the n AND gates 22 at the former stage side and inverted data of the output of the error detection determiner 9. In other words, the n AND gates 23 at the latter stage side output the outputs of the n AND gates 22 at the former stage side as they are when the error detection determiner 9 determines that there is no error whereas output 0s when the error detection determiner 9 determines that there is an error.

As described above, the error correction controller 10 outputs 0s when the error detection determiner 9 determines that the syndrome information s has an error whereas outputs decoded error position information when the error detection determiner 9 determines that the syndrome information s has no errors.

The error corrector 6 has n ExOR gates 24 for n bits of the input data d'. Each ExOR gate 24 takes the logical exclusive OR of the corresponding bit of the input data d' and the output of the corresponding AND gate 23 at the latter stage side in the error correction controller 10. In other words, each ExOR gate 24 outputs the corresponding bit of the input data d' as it is when the corresponding bit of the output of the error correction controller 10 is 0 whereas inverts the corresponding bit of the input data d' to output the inverted bit when the corresponding bit of the output of the error correction controller 10 is 1.

The input switch 8 has, for example, n AND gates 25 for the same number of bits as the input data d' and n ExOR gates 26. Each AND gate 25 outputs the bit of the output of the corresponding AND gate 22 at the former stage side in the error correction controller 10 as it is when the ECC_verify signal is active whereas outputs 0 when the ECC_verify signal is inactive. As described above, the n AND gates 25 feed back the error position information to the input side of the syndrome calculator 4 when the ECC_verify signal is active.

Each ExOR gate 26 takes the logical exclusive OR of the corresponding bit of the input data d' and the output of the corresponding AND gate 25. The outputs of the n ExOR gates 26 are input to the syndrome calculator 4 and the parity calculator 13. Since the ECC_verify signal is inactive immediately after the beginning of an error correction process, the n ExOR gates 26 input the input data d' as it is to the syndrome calculator 4 and the parity calculator 13.

When the ECC_verify signal becomes active, the n ExOR gates 26 input the outputs of the n AND gates 22 at the former stage side in the error correction controller 10 to the syndrome calculator 4 and the parity calculator 13.

Figure 4:
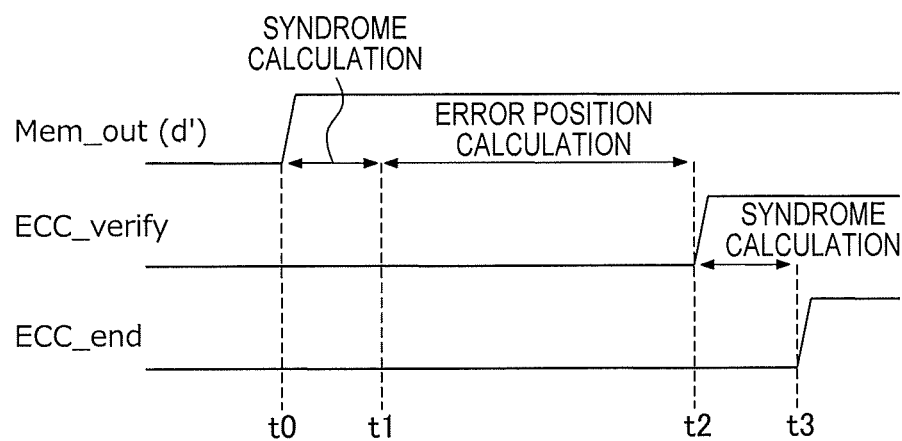
FIG. 4 is a timing chart of the memory system of FIG. 2.

FIG. 4 is a timing chart of the memory system 2 of FIG. 2. The data (input data d') read from the memory system 2 at time t0 is input to the error correction circuit 1. The syndrome calculator 4 performs syndrome calculation during times t0 to t1 to output the syndrome information s.

Thereafter, the error position calculator 5 calculates an error position during times t1 to t2 to output error position information. As shown in FIG. 4, the error position calculation requires a longer time than the syndrome calculation.

When the ECC_verify signal becomes active at time t2, the error position information is fed back to the input side of the syndrome calculator 4, so that the ExOR gates 26 perform error correction of the input data d' to input error-corrected data to the syndrome calculator 4. The syndrome calculator 4 performs again the syndrome calculation during times t2 to t3 to output again the syndrome information s. Based on the syndrome information s output again, the error detection determiner 9 determines whether to perform error correction and, based on the determination result, the error corrector 6 corrects the error of the input data d' to output the error-corrected input data d' or outputs the input data d' as it is. The error correction outputter 12 holds and outputs the output of the error corrector 6 at the timing at which the ECC_end signal becomes active, at time t3.

As described above, by providing the parity calculator 13 and the error detection calculator 14, the second embodiment can detect errors of the number of bits exceeding the error detection capability of the syndrome calculator 4 by one bit. However, when errors cannot be corrected exactly based on the calculation result of the syndrome calculator 4, the input data d' is output as it is with no error correction. Accordingly, there is no possibility that the error correction circuit 1 outputs data including errors of the number of bits equal to or larger than the number of error bits included in the input data d'.

Third Embodiment

A third embodiment is different from the second embodiment concerning the location of the holder 7.

Figure 5:
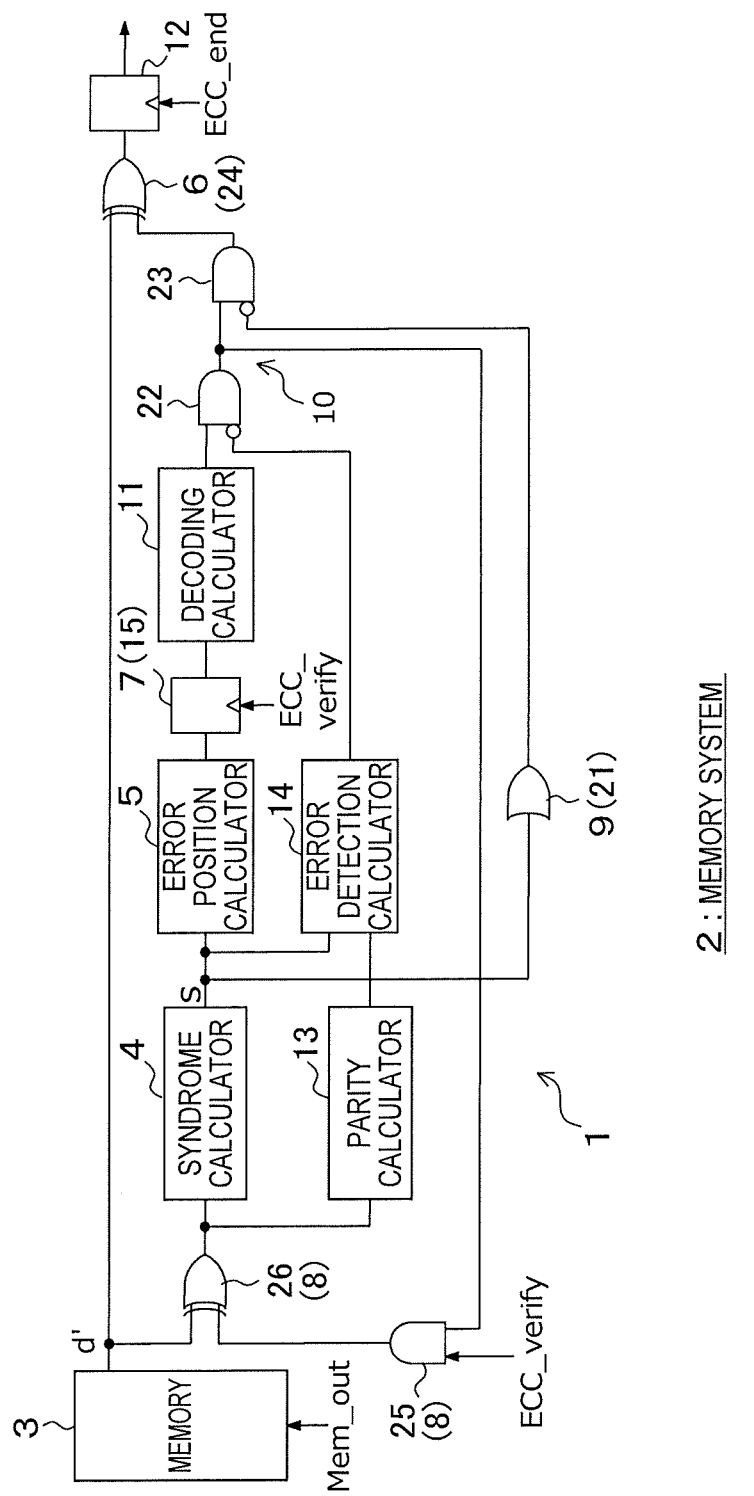
FIG. 5 is a block diagram schematically showing the configuration of a memory system provided with an error correction circuit according to a third embodiment.

FIG. 5 is a block diagram schematically showing the configuration of a memory system 2 having an error correction circuit 1 according to the third embodiment. The error correction circuit 1 of FIG. 5 is common with the error correction circuit 1 of FIG. 2 except that the location of the holder 7 is different.

The holder 7 of FIG. 5 holds error position information output from the error position calculator 5. The error position information is composed of, for example, m bits. Therefore, the holder 7 has m latches 15 for holding the respective bits of the error position information. Since, also m latches 15 each shown in FIG. 3 are required in the second embodiment, the number of required latches 15 is the same for the holders 7 of FIG. 2 and FIG. 5. Each latch 15 outputs the error position information, as it is, output from the error position calculator 5 while the ECC_verify signal is inactive whereas holds the error position information at the timing at which the ECC_verify signal becomes active.

The decoding calculator 11 of FIG. 5 decodes error position information output from the m latches 15 to convert the error position information into n-bit (for example, n>m) error position information. The n-bit error position information output from the decoding calculator 11 passes through the AND gates 25 in the input switch 8 and is fed back to the input side of the syndrome calculator 4 at the timing at which the ECC_verify signal becomes active. In more specifically, the ExOR gates 26 in the input switch 8 generate error-corrected data obtained by correcting an error of input data d' using the error position information, the generated error-corrected data being input to the syndrome calculator 4. Therefore, while the ECC_verify signal is active, the syndrome calculator 4 generates syndrome information s of the error-corrected data.

As described above, when the ECC_verify signal changes from inactive to active, the syndrome information s changes, and the error position information calculated by the error position calculator 5 also changes in accordance with the change of the syndrome information s. However, while the ECC_verify signal is active, the holder 7 continues the prior holding operation, so that, even if the error position information output from the error position calculator 5 changes, the input data d' of the decoding calculator 11 does not change. Therefore, the decoding calculator 11 continues to output error position information in accordance with the syndrome information s initially calculated by the syndrome calculator 4.

The timing chart for the error correction circuit 1 of FIG. 5 is the same as that shown in FIG. 4. When there is no error in the syndrome information s calculated again by the syndrome calculator 4, based on the error position information, the error corrector 6 inverts the corresponding bits of the input data d'. On the other hand, when there is an error in the syndrome information s calculated again, the error corrector 6 outputs the input data d' as it is with no error correction.

As described above, the error correction circuit 1 of FIG. 5 holds the error position information output from the error position calculator 5 at the timing at which the ECC_verify signal becomes active and feeds back the error position information to the input side of the syndrome calculator 4, so that the syndrome calculator 4 can calculate again the syndrome information s of the error-corrected data. Only when the syndrome information s calculated again has 0s only, error correction of the input data d' is performed using the held error position information. If not 0s only, the input data d' is output as it is, so that there is no problem of increase in the number of error bits of the input data d', by passing the input data d' to the error correction circuit 1. The error correction circuit 1 of FIG. 5 can be realized with the same hardware scale as the error correction circuit 1 of FIG. 2, with the same effects as the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An error correction circuit comprising:
   a syndrome calculator to calculate syndrome information of input data comprising a plurality of bits;
   an error position calculator to calculate error position information of the input data, based on the syndrome information;
   a holder to hold the syndrome information or the error position information at a predetermined timing;
   an error detection determiner to determine whether an error of the input data is correctly detected, based on syndrome information calculated by inputting error-corrected data, based on the error position information to the syndrome calculator; and
   an error corrector to output the input data after correcting the error of the input data based on information held by the holder when it is determined by the error detection determiner that the error is correctly detected, and to output the input data with no error correction when it is determined by the error detection determiner that the error is not correctly detected.

2. The error correction circuit of claim 1, wherein the holder holds the syndrome information or the error position information, at the predetermined timing after the error position calculator outputs the error position information,
   wherein the syndrome calculator calculates the syndrome information of the error-corrected data after the holder holds the syndrome information or the error position information.

3. The error correction circuit of claim 1, further comprising an input switch to select one of error-corrected data of the input data based on the error position information, and the input data, and to input the selected data to the syndrome calculator, in synchronism with the predetermined timing,
   wherein the error detection determiner determines whether the error of the input data is correctly detected, based on the syndrome information calculated by the syndrome calculator when the input switch selects the error-corrected data.

4. The error correction circuit of claim 3, wherein the input switch inputs the input data to the syndrome calculator before the predetermined timing and inputs the error-corrected data of the input data based on the error position information to the syndrome calculator after the predetermined timing.

5. The error correction circuit of claim 3, wherein the holder holds the syndrome information or the error position information, in synchronism with a switching signal with logic changing at the predetermined timing, and
   the input switch switches between the input data and the error-corrected data, and inputs the switched data to the syndrome calculator, in synchronism with the switching signal.

6. The error correction circuit of claim 1, wherein the error detection determiner determines whether the error of the input data is correctly detected, according to whether all bits composing the syndrome information are same in logic.

7. The error correction circuit of claim 1 further comprising:
   a parity calculator to calculate whether there are an odd number of bit errors in the input data, based on a parity bit included in the input data; and
   an error detection calculator to detect errors of a certain number of bits equal to or smaller than a predetermined number of bits exceeding error detection capability of the syndrome calculator, based on a calculation result of the parity calculator and the syndrome information,
   wherein, irrespective of a calculation result of the error detection calculator, the error corrector outputs the input data with no error correction when it is determined by the error detection determiner that the error of the input data is not correctly detected.

8. The error correction circuit of claim 1, further comprising a decoding calculator to convert a certain number of bits of the error position information into a certain number of bits composing the input data,
   wherein the error corrector corrects the error of the input data based on error position information obtained after the decoding calculator converts the number of bits, and
   the holder inputs the error position information output from the error position calculator to the decoding calculator until the predetermined timing, and holds the error position information output from the error position calculator, at the predetermined timing, and inputs the held error position information to the decoding calculator.

9. The error correction circuit of claim 1, wherein the holder inputs the syndrome information output from the syndrome calculator to the error position calculator until the predetermined timing, and holds the syndrome information output from the syndrome calculator, at the predetermined timing, and inputs the held syndrome information to the error position calculator.

10. A memory system comprising:
a memory; and
an error correction circuit to perform error correction of read data read from the memory, the read data comprising a plurality of bits, wherein the error correction circuit comprises:
a syndrome calculator to calculate syndrome information of the read data;
an error position calculator to calculate error position information of the read data based on the syndrome information;
a holder to hold the syndrome information or the error position information at a predetermined timing;
an error detection determiner to determine whether an error of the read data is correctly, detected, based on syndrome information calculated by inputting error-corrected data based on the error position information to the syndrome calculator; and
an error corrector to output the read data after correcting the error of the read data based on information held by the holder when it is determined by the error detection determiner that the error is correctly detected, and to output the read data with no error correction when it is determined by the error detection determiner that the error is not correctly detected.

11. The memory system of claim 10, wherein the holder holds the syndrome information or the error position information, at the predetermined timing after the error position calculator outputs the error position information, and
the syndrome calculator calculates the syndrome information of the error-corrected data after the holder holds the syndrome information or the error position information.

12. The memory system of claim 10, further comprising an input switch to select one of error-corrected data of the read data based on the error position information, and the read data, and to input the selected data to the syndrome calculator, in synchronism with the predetermined timing,
wherein the error detection determiner determines whether the error of the read data is correctly detected, based on the syndrome information calculated by the syndrome calculator when the input switch selects the error-corrected data.

13. The memory system of claim 12, wherein the input switch inputs the read data to the syndrome calculator before the predetermined timing and inputs the error-corrected data of the read data based on the error position information to the syndrome calculator after the predetermined timing.

14. The memory system of claim 12, wherein the holder holds the syndrome information or the error position information, in synchronism with a switching signal with logic changing at the predetermined timing, and
the input switch switches between the read data and the error-corrected data, and inputs the switched data to the syndrome calculator, in synchronism with the switching signal.

15. The memory system of claim 10, wherein the error detection determiner determines whether the error of the read data is correctly detected, according to whether all bits composing the syndrome information are same in logic.

16. The memory system of claim 10 further comprising:
a parity calculator to calculate whether there are an odd number of bit errors in the read data, based on a parity bit included in the read data; and
an error detection calculator to detect errors of a certain number of bits equal to or smaller than a predetermined number of bits exceeding error detection capability of the syndrome calculator, based on a calculation result of the parity calculator and the syndrome information,
wherein, irrespective of a calculation result of the error detection calculator, the error corrector outputs the read data with no error correction when it is determined by the error detection determiner that the error of the read data is not correctly detected.

17. The memory system of claim 10, further comprising a decoding calculator to convert a certain number of bits composing the error position information into a certain number of bits composing the read data,
wherein the error corrector corrects the error of the read data based on error position information obtained after the decoding calculator converts the number of bits, and
the holder inputs the error position information output from the error position calculator to the decoding calculator until the predetermined timing, and holds the error position information output from the error position calculator, at the predetermined timing, and inputs the held error position information to the decoding calculator.

18. The memory system of claim 10, wherein the holder inputs the syndrome information output from the syndrome calculator to the error position calculator until the predetermined timing, and holds the syndrome information output from the syndrome calculator, at the predetermined timing, and inputs the held syndrome information to the error position calculator.

* * * * *